(12) United States Patent
Cai et al.

(10) Patent No.: US 7,692,289 B2
(45) Date of Patent: Apr. 6, 2010

(54) SEMICONDUCTOR DEVICES WITH IMPROVED HEAT DISSIPATION AND METHOD FOR FABRICATING SAME

(75) Inventors: Li Cai, Shakopee, MN (US); James M. Van Hove, Eagan, MN (US); Amanda Jo Jepson, Monticello, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 689 days.

(21) Appl. No.: 10/217,089

(22) Filed: Aug. 12, 2002

(65) Prior Publication Data

US 2004/0026779 A1 Feb. 12, 2004

(51) Int. Cl.
*H01L 23/10* (2006.01)

(52) U.S. Cl. ................ 257/706; 257/712; 257/E23.101

(58) Field of Classification Search .................. 257/94, 257/620, 622, 613, 623, 628, 712, 717–720, 257/714, 706, 675, 722, 796, 729–730, E23.101, 257/E31.131, E33.075, E23.051
See application file for complete search history.

(56) References Cited

U.S. PATENT DOCUMENTS

| | | | |
|---|---|---|---|
| 4,237,601 A | 12/1980 | Woolhouse et al. | |
| 4,689,125 A | 8/1987 | Burrus, Jr. et al. | |
| 4,883,771 A | 11/1989 | Kumabe et al. | |
| 5,195,021 A * | 3/1993 | Ozmat et al. | 257/712 X |
| 5,276,584 A * | 1/1994 | Collins et al. | 361/718 |
| 5,284,792 A | 2/1994 | Forster et al. | |
| 5,373,174 A * | 12/1994 | Yamamoto | 257/88 |
| 5,453,641 A * | 9/1995 | Mundinger et al. | 257/714 |
| 5,608,750 A | 3/1997 | Nakatsuka et al. | |
| 5,659,413 A * | 8/1997 | Carlson | 398/122 |
| 5,882,988 A | 3/1999 | Haberern et al. | |
| 5,923,084 A * | 7/1999 | Inoue et al. | 257/712 |
| 5,977,567 A * | 11/1999 | Verdiell | 257/99 |
| 6,219,364 B1 * | 4/2001 | Dei | 372/36 |
| 6,696,704 B1 * | 2/2004 | Maeda et al. | 257/98 |
| 6,743,972 B2 * | 6/2004 | Macris | 136/201 |

* cited by examiner

*Primary Examiner*—Davienne Monbleau
*Assistant Examiner*—Hoa B Trinh
(74) *Attorney, Agent, or Firm*—Carlson, Caspers, Vandenburgh & Lindquist

(57) ABSTRACT

The present invention is directed to improving the efficiency of removing heat from semiconductor devices. In addition, the method of manufacturing the improved devices has the potential of eliminating a key step in the traditional production process where the chips are highly susceptible to mechanical damage. A semiconductor element includes a semiconductor substrate having a heat removal side and a heat producing region, and at least one superstrate semiconductor layer defining the heat producing region. The heat removal side of the semiconductor substrate includes at least one recess region which extends closer to the heat-generating region than the remainder of the heat removal surface.

16 Claims, 3 Drawing Sheets

SEMICONDUCTOR DEVICES WITH IMPROVED HEAT DISSIPATION AND METHOD FOR FABRICATING SAME

FIELD OF THE INVENTION

The present invention is directed generally to a semiconductor device, and more particularly to a device with enhanced heat dissipation and a method to enhance the extraction of heat from the semiconductor device.

BACKGROUND

Semiconductor devices are abundant today in different forms of electronic and optical systems. Current research and development trends are pushing the data rates of computer semiconductor chips to speeds well in excess of 1 Gigahertz and optical semiconductor laser diodes are being pushed to ever increasing output powers. Many other examples could be cited with similar trends, faster speeds and higher output powers. Semiconductor chips can generate sufficient internal heat to degrade their operational performance and in extreme cases may cause permanent damage to the chip. Typically, these considerations lead to restrictions on the ambient temperature ranges the devices can operate over and limitations on how the devices can be packaged. Given this, techniques have been developed to assist in cooling these devices to increase their operational range and performance. Some semiconductor chips are mounted on active devices such as thermo-electric (TE) coolers, sometimes referred to as Peltier coolers or heat pumps, which are electrically driven and actively remove heat from semiconductor devices. Typically, in the case of laser diodes, the semiconductor chip is metallized on its bottom surface and adhered to a submount, which in turn is mounted via soldering to the TE cooler. In turn, the TE cooler is typically mounted on a physically larger heat sink which dissipates thermal energy received from TE cooler.

Laser diodes have high demands for heat removal from semiconductor devices. This is because the thermal energy is generated in extremely small volumes, the active lasing region may be as small as one micron or so in the cross sectional dimension extending over a length on the order of a millimeter. Given this, the thermal energy density is extremely high and it is important to remove the heat from this region efficiently. In current manufacturing techniques, these devices are fabricated by growing the semiconductor layers on a substrate material via an epitaxial process such as molecular beam epitaxial (MBE) growth or metal organic chemical vapor deposition (MOCVD). To maintain mechanical strength and integrity during the manufacturing process, the substrate material during the growth process may be thicker than in the final product. The substrate material is mechanically ground and polished to its final thickness dimension following the growth process. This is done for two reasons.

First, hundreds, maybe even thousands, of these identical semiconductor devices are fabricated on a common substrate wafer which will need to be mechanically cut (cleaved) and separated from one another. Secondly, if the substrate material were left in its thick format the devices would be in danger of overheating and self-destructing due to the large thermal impedance across the substrate. Given this, the substrate material may be mechanically lap polished prior to cleaving. Unfortunately, some popular semiconductor materials (e.g., Indium Phosphide) are extremely brittle and are prone to shattering during the mechanical lapping process.

In view of these problems, there is a need for an improved method for enhancing the removal of heat from semiconductor devices, particularly laser diodes. There is also a need to reduce breakage of semiconductor chips in the final mechanical lapping step of fabrication.

SUMMARY OF THE INVENTION

The present invention is directed to improving the efficiency of removing heat from semiconductor devices. In addition, the method of manufacturing the improved devices has the potential of eliminating a key step in the traditional production process where the chips are highly susceptible to mechanical damage. One embodiment of the invention is directed to a semiconductor element which includes a semiconductor substrate having a heat removal side and a heat producing region, and at least one superstrate semiconductor layer defining the heat producing region. The heat removal side of the semiconductor substrate includes at least one recess region which extends closer to the heat-generating region than the remainder of the heat removal surface.

Another embodiment of the invention is directed to a semiconductor wafer which includes at least one superstrate layer defining a plurality of heat producing regions and a heat removal side opposite the at least one superstrate layer. The heat removal side includes a plurality of heat removal recess regions on the heat removal side below the heat producing regions and a plurality of cleavage recess regions defining cleavage lines where the wafer substrate is to be cleaved.

Another embodiment of the invention is directed to a method of manufacturing a semiconductor substrate which includes forming at least one recess region on a first side of the semiconductor substrate at a position corresponding to a heat producing region and forming superstrate layers on a second side of the semiconductor substrate to define the heat producing region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
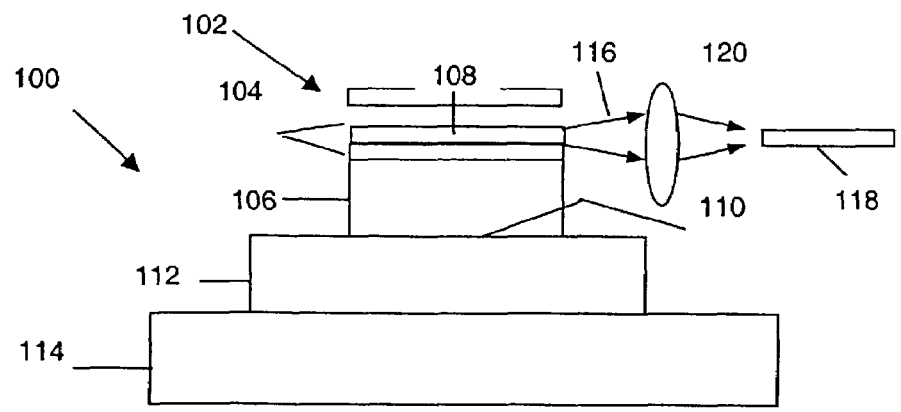
FIG. 1 illustrates a semiconductor laser diode module where the output optical energy is focused into a fiber optic element via a coupling lens.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to semiconductor devices, and is believed to be particularly suited to semiconductor laser diodes. The approach presented here may also simplify the manufacturing process for fabricating these devices.

The semiconductor device includes one or more recess regions or channels protruding into the bottom surface of the substrate material which would otherwise be flat. The recess regions or channels may be filled with a metal, metal alloy, or other material of high thermal conductivity to generate low resistance pathways through the substrate for thermal energy generated on the other side of the substrate.

According to some embodiments of the present invention, metal reinforcements protrude into the recess regions of the semiconductor chip, giving added mechanical integrity to the semiconductor device. The chip may therefore be manufactured in a thinner format, possibly eliminating the grinding step where mechanical breakage can occur.

An embodiment of a laser module 100 is schematically illustrated in FIG. 1. A semiconductor laser 102 is formed from a number of superstrate layers 104 formed over a substrate 106. The superstrate layers 104 include an active layer 108, which may be a quantum well active layer. The superstrate layers 104 may also include layers that provide optical confinement of laser light within the laser 102 in the vertical and/or horizontal direction. The substrate 106, whose lower surface 110 is typically metallized, may be soldered to a sub-mount 112 which is, in turn attached to a heatsink unit 114. Laser 102 may also be mounted directly to the heatsink unit 114, without an intervening sub-mount 112.

The heatsink unit 114 may include a passive heatsink, or may include an active heatsink, for example a thermo-electric (TE) cooler. Where an active heatsink is used, the active heatsink may also be thermally coupled to a passive heatsink. The optical output 116 from the laser 102 may be coupled to an optical fiber 118 via a focusing system 120 having one or more lenses, or may be coupled directly into a lensed fiber.

The substrate 106 may be formed from any suitable material used as a substrate for semiconductor lasers. Common substrate materials include gallium arsenide (GaAs) and indium phosphide (InP), although other types of materials may also be used, and the scope of the invention is not intended to be limited to the materials listed herein. The choice of semiconductor material for the substrate 106 is largely dependent on the desired operational wavelength of the laser 102. For wavelengths in the visible to near infra-red regimes, GaAs is commonly used, whereas InP is commonly used for lasers whose output is in the range 1.4–1.6 μm, a wavelength range useful for many optical communications applications.

Figure 2:
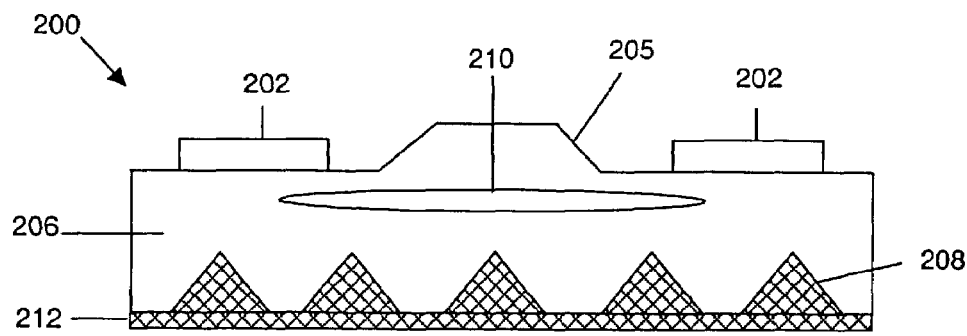
FIG. 2 illustrates one embodiment of the substrate geometry wherein the bottom surface of the substrate consists of a series of metal-filled recess regions.

FIG. 2 is an enlarged end-on view of one particular embodiment of a laser diode 200, not drawn to scale. For this embodiment, transverse optical confinement is provided by a ridge waveguide 205. One or more bonding pads 202 may be positioned to the side of the ridge 205. It will be appreciated that transverse optical confinement may be provided using other approaches, for example a buried heterostructure, or the like. The bottom surface of the substrate 206 may have a metallization layer 212 and may have a series of recess regions 208. The recess regions 208 may be filled with a metal, metal alloy, or other highly thermal conductive material, to enhance heat transfer from the region of the laser diode 200 that generates heat, through the substrate 206 to the metallization layer 212.

Although the recess regions 208 are depicted as a series spanning the width of the substrate 206, this is not a necessary condition, and the recess regions 208 may, for example extend across a smaller portion of the substrate 206. For one particular example, the one or more recess regions 208 are disposed only under the active region 210. Also, the recess regions 208 may take on different shapes. These shapes are typically defined by the etching techniques and chemical composition of the substrate 206. For example, $H_2SO_4$—$H_2O_2$ chemistries have been used to etch GaAs substrates forming V-groove type geometries. Similarly, $HCl$—$H_3PO_4$ chemistries are suitable for etching InP materials, and depending on the substrate crystal orientation may produce V-groove, squared-off, or rounded type recesses.

Figure 3:
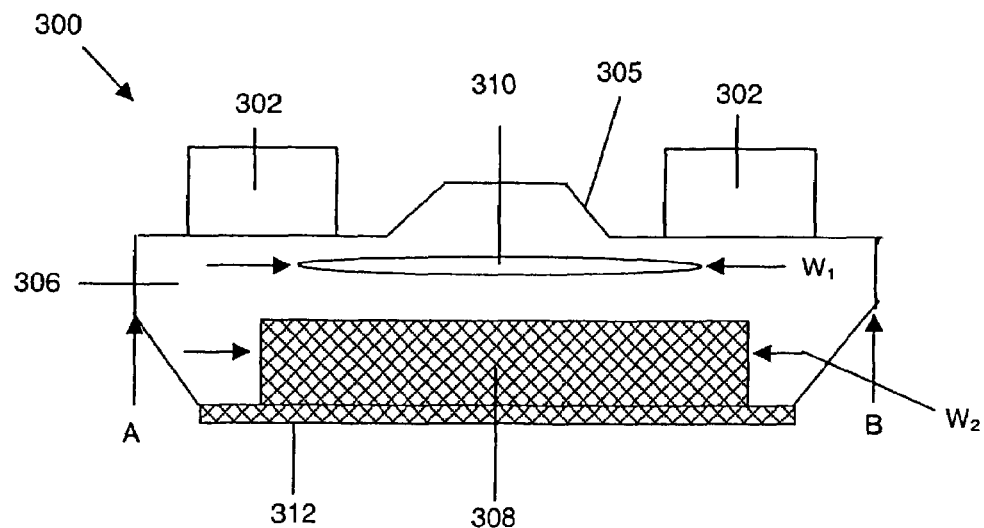
FIG. 3 illustrates an alternative embodiment of the substrate geometry where a single metal-filled channel runs underneath the lasing region and the semiconductor chip has been mechanically cleaved in the vicinity of an un-filled recess region intentionally designed for that purpose.

Another embodiment of a laser diode 300 is depicted in FIG. 3, which shows an end-on view of the substrate 306 with a single squared-off metal-filled recess region 308. The bottom surface of the substrate 306 may have a metallization layer 312. Bonding pads 302 are typically situated on either side of the ridge waveguide 305. The recess region 308 may be a channel running underneath the active region 310, along the length of the laser diode 300. As shown in FIG. 3, again not to scale, the width $W_2$ of the metal-filled recess region 308 may be larger than the width $W_1$ of the active region 310. Typical dimensions for the width $W_1$ of the active region 310 for a laser diode may be one to five microns, whereas the width W2 of the metal-filled recess region 308 may extend up to and beyond one hundred microns. It may be appreciated that in the case where W2 is larger than W1, this may aid in the manufacturing process to ensure the metal-filled recess region 308 is located directly underneath the active region 310. Locations A and B depict positions where the substrate has been mechanically cleaved through un-filled recess regions. The recesses at locations A and B may be formed by appropriate masking and etching processes, and preserved unfilled during the metallizaton phase via masking.

Figure 4:
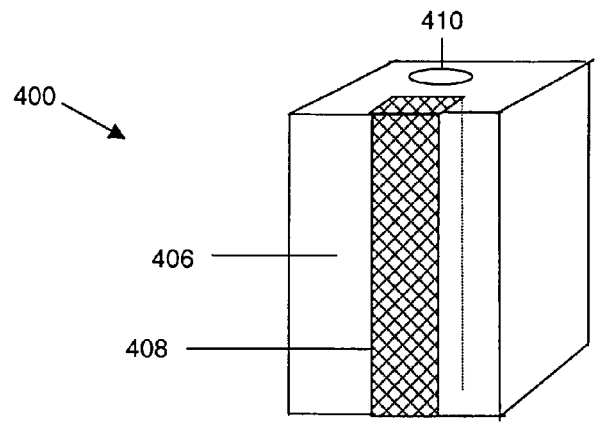
FIG. 4 illustrates a bottom view of the substrate shown in FIG. 3, depicting the metal-filled channel, in this case a Square-off groove, running along the length of the semiconductor chip.

FIG. 4 illustrates an oblique bottom view of a semiconductor laser 400, with a squared-off type recess 408 or channel which may run along the entire bottom surface of the substrate 406. In this particular embodiment, the channel 408 is illustrated to be filled with a highly thermally conductive material, for example a metal or metal alloy. The channel 408 may extend over the length of the substrate 406, or may extend over only a portion of the substrate 406.

Different channel shapes, for example, V-groove, circular, elliptical and the like, may be formed by varying the etchant chemistry and by etching along different crystalline planes in the substrate 406. Also, the depth of the channel may be varied by increasing the time duration of the etching process, thereby controlling the proximity of the metal-filled channel 408 to the active region 410. Typically, the entire bottom surface of the substrate 406 would have a metallization layer; this metallization layer has intentionally been left out of FIG. 4 to highlight the placement and geometrical shape of the metal-filled recess region 408. This embodiment is particularly advantageous for substrates carrying laser diode structures where the heat may be generated in small volumes and efficient removal of the heat may extend the life and increase the operational performance of the laser 400.

Figure 5:
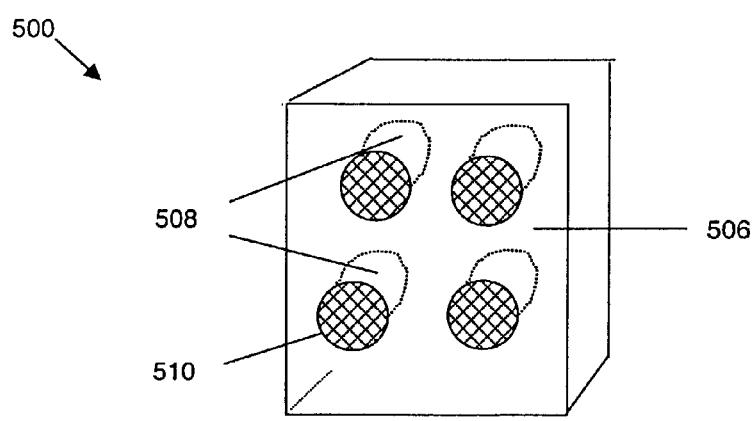
FIG. 5 illustrates an alternative embodiment of the geometry and distribution of metal-filled recess regions on the bottom of the semiconductor chip.

FIG. 5 illustrates an oblique bottom view of a semiconductor device 500, depicting another embodiment for the geometry and distribution of recess regions 508. The surface aperture 510 for each recess region 508 may take on a different geometrical shape (for example circular, elliptical or the like) Furthermore, the cross sectional shape of the recess 508 extending into the substrate 506 may be varied, and, for example, may be rounded (as illustrated), a squared-off well, or triangular. Also, the recess may or may not be provided with a thermally conductive material, such as a metal or metal alloy, depending on the function of the recess 508. Where the recess 508 is used to control the position of a cleavage plane, the recess 508 may not be metallized. On the other hand, the provision of a metal or metal alloy in the recess 508 results in the ability to efficiently extract heat through the substrate 506. Typically, the entire bottom surface of the substrate 506 would have a metallization layer, this metallization layer has intentionally been left out of FIG. 5 to highlight the placement and geometrical shape of the surface apertures 510. Different size, number, and location of the surface apertures 510 and recess regions 508 may be fabricated and alternative recess region geomerties 508 may be produced by varying the ecthant chemistry and etching along different crystalline planes in the substrate 506.

Figure 6:
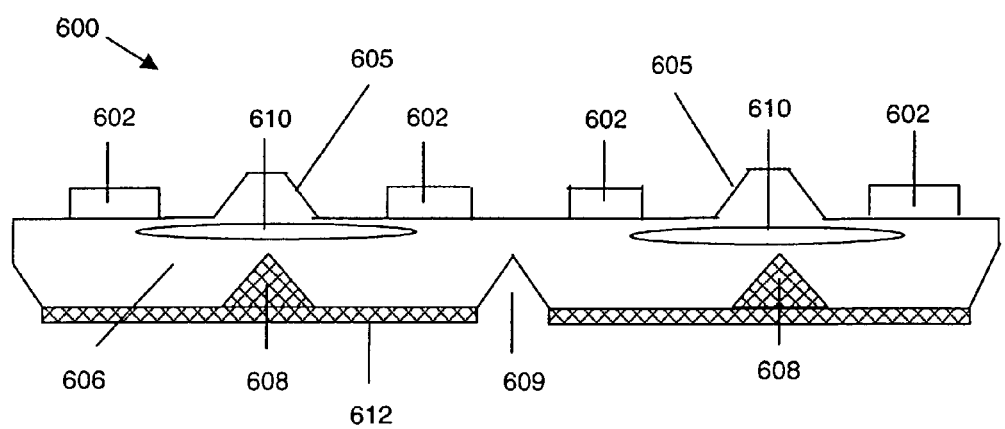
FIG. 6 illustrates an end-on view of a partially processed semiconductor wafer.

FIG. 6 illustrates an end-on view of a partially processed semiconductor wafer 600. Shown are two side-by-side laser diodes on a common substrate 606. Each laser diode may have a ridge waveguide 605 and bonding pads 602 on either side of their respective active region 610. The bottom surface of the substrate 606 may have a metallization layer 612 over all or part of its bottom surface. The substrate 606 may also have metal-filled 608 and non metal-filled 609 recess regions on its bottom surface. The metal-filled recess regions 608, provided for increased heat transfer, through the substrate 606, may take on different geometrical shapes, for example V-groove, squared-off, rounded-off or the like. The non metal-filled recess regions 609 may be manufactured by appropriate masking prior to the metallization phase. The laser diodes may ultimately be separated via mechanical cleaving which may be initiated at the site of the non metal-filled recess region 609. Different size and geometries for the unfilled recess region 609 may be realized by varying the etchant chemistry and etching along different crystalline planes of the substrate 606. The unfilled recess regions 609 may be formed into a pattern as illustrated in FIG. 8, below.

Figure 7:
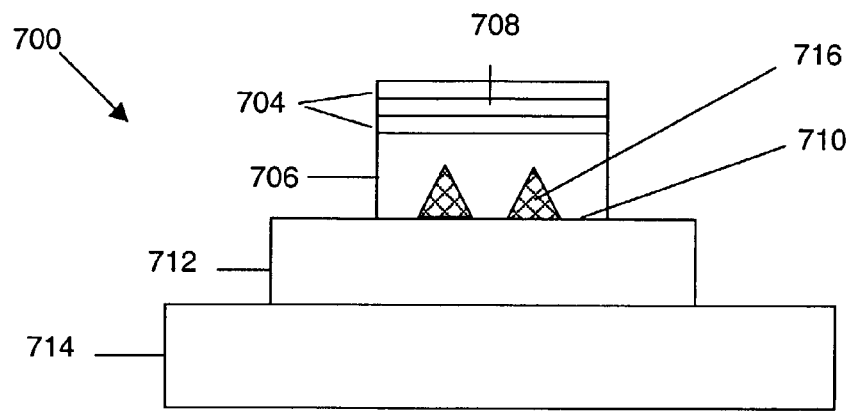
FIG. 7 illustrates an end-on view of a semiconductor element.

An embodiment of a semiconductor element 700 is illustrated in FIG. 7. The substrate 706 may be formed from any suitable material used as a substrate for laser diodes, light emitting diodes (LED's), computer chips, semiconductor switching elements, or semiconductor digital signal-processing (DSP) elements, or other types of semiconductor elements that generate heat. Common substrates for these devices include silicon, germanium, silicon carbide, and gallium nitride, although other types of materials may also be used, and the scope of the invention is not intended to be limited to the materials listed herein. The superstrate layers 704 include a heat-producing region 708, which may contain one or more active devices such as a diode junction, transistor, and the like. The bottom of the substrate 706 is typically metallized and serves as the heat removal surface 710 for the semiconductor element 700. The heat removal surface 710 may include one or more metal-filled recess regions 716 or channels to reduce the thermal resistance between the heat producing region 708 and the heat removal surface 710. The substrate 706 may be soldered, or otherwise attached, to the submount unit 712 which is, in turn attached to a heat sink unit 714. The semiconductor element 700 may also be mounted directly to the heat sink unit 714, without an intervening submount 712. Adhesion of the substrate 706 to the submount 712 or directly to the heat sink 714 may be accomplished by soldering, by using a thermally conductive epoxy or some other suitable method.

Figure 8:
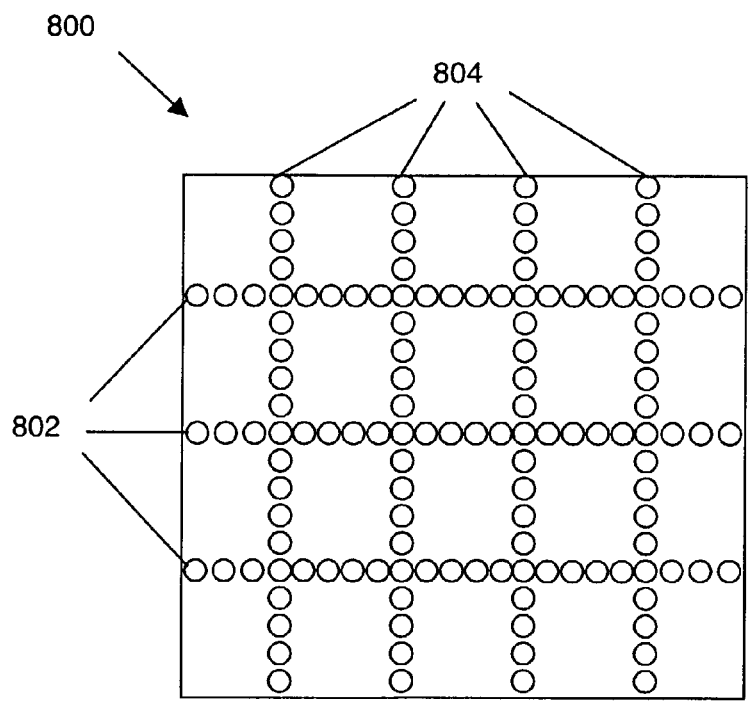
FIG. 8 illustrates a bottom view of a semiconductor wafer substrate with a series of horizontal and vertical rows of discrete recess regions.

FIG. 8 illustrates a bottom view of a semiconductor wafer substrate 800 with a series of horizontal 802 and vertical 804 rows of discrete recess regions, for example the unfilled recess regions 609 illustrated in FIG. 6. These recess regions may provide horizontal and vertical cleavage lines where the wafer substrate 800 is to be cleaved.

As noted above, the present invention is applicable to semiconductor devices and is believed to be particularly useful in semiconductor laser diodes. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification.

For example, it will be appreciated that semiconductor computer chips are running at higher and higher processing speeds, and consuming and dissipating more thermal energy. Concurrently, microprocessor driven devices are becoming smaller and smaller and thermal considerations are a natural consequence.

We claim:

1. A semiconductor chip element, comprising:
   a semiconductor substrate having a heat removal side and a heat producing region, at least one superstrate semiconductor layer integrally formed on the substrate and defining the heat producing region, the heat removal side including at least one recess region, the at least one recess region extending closer to the heat generating region than the remainder of the heat removal surface outside the at least one recess region;
   a submount, the heat removal side of the substrate being attached to a first side of the submount; and
   a layer of heat conducting material between the heat removal side of the substrate and the submount, the layer of heat conducting material substantially filling spaces between the at least one recess region of the heat removal side and the submount.

2. A semiconductor element as recited in claim 1, further comprising a heatsink attached to a second side of the submount.

3. A semiconductor element as recited in claim 1, further comprising a metallic coating on the heat removal side of the semiconductor substrate, the metallic coating extending into the at least one recess region.

4. A semiconductor element as recited in claim 1, wherein the at least one superstrate layer defines an elongated heat producing region and the at least one recess region includes an elongated groove on the heat removal side of the substrate corresponding to the heat producing region.

5. A semiconductor element as recited in claim 4, wherein the at least one superstrate layer includes an active region of a semiconductor laser diode, and the elongated groove extends under, and parallel to, the active region of the semiconductor laser.

6. A semiconductor element as recited in claim 1, wherein the heat producing region is part of a semiconductor light emitting diode.

7. A semiconductor element as recited in claim 1, wherein the heat producing region is part of a computer chip.

8. A semiconductor element as recited in claim 1, wherein the heat producing region is part of a semiconductor-switching element.

9. A semiconductor element as recited in claim 1, wherein the heat producing region is part of a semiconductor signal-processing element.

10. A semiconductor wafer, comprising:
a semiconductor wafer substrate having at least one superstrate semiconductor layer defining a plurality of heat producing regions and a heat removal side opposite the at least one superstrate layer, the heat removal side including a plurality of heat removal recess regions on the heat removal side below the heat producing regions and a plurality of cleavage recess regions defining cleavage lines where the wafer substrate is to be cleaved; and
a metallic layer disposed over at least part of the heat removal side.

11. A semiconductor wafer as recited in claim 10, wherein the metallic layer extends into spaces formed by the heat removal recess regions.

12. A semiconductor wafer as recited in claim 11, wherein the metallic layer fills the spaces formed by the heat removal recess regions.

13. A semiconductor wafer as recited in claim 10, wherein the at least one superstrate layer defines a plurality of semiconductor laser active regions and the plurality of cleavage recess regions define individual laser elements formed on the semiconductor wafer.

14. A semiconductor wafer as recited in claim 13, wherein the plurality of heat removal recess regions includes elongated channels disposed below, and parallel to, respective active regions of the semiconductor laser active regions.

15. A semiconductor element as recited in claim 1, wherein the heat conducting layer comprises a metallic layer.

16. A semiconductor element as recited in claim 1, wherein the heat conducting layer comprises a heat conducting epoxy layer.

* * * * *